United States Patent

Herrmann et al.

[15] 3,683,290

[45] Aug. 8, 1972

[54] AUTOMATIC VOLUME CONTROL THROUGH PREAMPLIFIER SUPPLY VOLTAGES

[72] Inventors: Frank A. Herrmann, Hartsdale; Zygmund Shabad, New York, both of N.Y.

[73] Assignee: Gould Inc., Chicago, Ill.

[22] Filed: Nov. 13, 1970

[21] Appl. No.: 89,348

[52] U.S. Cl. ..........................330/15, 330/22, 330/29
[51] Int. Cl. ..............................H03f 3/26, H03g 3/30
[58] Field of Search.....330/29, 15, 22, 123, 128, 139

[56] References Cited

UNITED STATES PATENTS

| | | | |
|---|---|---|---|
| 3,546,616 | 12/1970 | Hargasser et al. | 330/29 |
| 3,344,355 | 9/1967 | Massman | 330/29 UX |
| 3,487,324 | 12/1969 | Jones | 330/15 UX |
| 3,168,708 | 2/1965 | Stuart-Williams et al. | 330/22 |

FOREIGN PATENTS OR APPLICATIONS

| | | | |
|---|---|---|---|
| 1,155,772 | 6/1969 | Great Britain | 330/29 |

*Primary Examiner*—Roy Lake
*Assistant Examiner*—James B. Mullins
*Attorney*—Ostrolenk, Faber, Gerb & Soffen

[57] ABSTRACT

Automatic volume control is effected in an audio amplifier comprising a multi-stage preamplifier and a direct current coupled output amplifier by processing the derived output signal to modify the preamplifier supply voltage.

2 Claims, 3 Drawing Figures

INVENTORS
FRANK HERRMANN
ZYGMUND SHABAD
BY
Ostrolenk, Faber, Gerb & Soffen
ATTORNEYS

AUTOMATIC VOLUME CONTROL THROUGH PREAMPLIFIER SUPPLY VOLTAGES

BACKGROUND OF THE INVENTION

1. Field of the Invention

This invention relates to audio amplifiers, in general, and to an automatic volume control system for use in such amplifiers as are employed in hearing aid units, in particular.

2. Description of the Prior Art

The importance and use of automatic volume control (AVC) in audio amplifiers has long been appreciated. For instance, in a hearing aid without such control, all sound including noise would be equally amplified, whereas intelligence could most be provided if only the desired signals were amplified. In addition, without automatic volume control, sounds of a relatively large amplitude might tend to overdrive the hearing aid amplifier, thereby increasing distortion and sound level to a value beyond a comfortable listening range. This, too results in a reduced intelligibility.

On the other hand, such automatic control in an amplifier limits the output level and results in less distortion and more comfortable listening. While automatic volume control systems cannot generally distinguish between useful signals and background noise, people in a noisy environment have been noted to raise their voices so as to be heard thereby enabling the control system to better focus on the useful signals to the detriment of the unwanted noise. As a result, the signal to noise ratio with such automatic volume control systems is improved to further increase intelligibility.

As will be appreciated, the automatic volume control systems presently known by and large operate by sampling the output signal of an amplifier stage, by rectifying the signal, by filtering it to obtain its direct current (d-c) component and by feeding that component in series with a fixed bias applied to the input stage of the amplifier construction. In many instances — such as in integrated circuit fabrications — the input stage is not easily accessible due to the limited number of terminals available on the integrated chip, so that application of the control signal to vary the fixed bias of the input stage is not readily possible.

SUMMARY OF THE INVENTION

As will become clear hereinafter, the present invention permits automatic volume control of such an integrated circuit transistor amplifier not by varying the bias of the input of a multistage amplifier, but by changing the base-to-emitter voltages of the following stages. To accomplish this, the control signal derived by processing the amplifier output signal is used to modify the preamplifier supply voltage. The level at which the control system takes effect can be easily controlled in this manner, with the amount of the control action once again being primarily dependent upon the magnitude of the output signal. While the present invention is particularly useful in a self-contained, integrated circuit amplifier, the arrangement of the invention is equally applicable in combination with a discrete component multistage amplifier comprising a preamplifier and an output stage. Similarly, the arrangement to be described is not to be limited to the hearing aid amplifier environment in which it has been noted to operate quite attractively, but can be equally useful in other types of direct coupled audio amplifier constructions.

Accordingly, it is an object of the present invention to provide a novel automatic volume control system for use with direct current coupled amplifiers in which variable biasing of an input stage by means of the control is not generally feasible.

In particular, it is an object of the invention to provide an automatic volume control system for such an amplifier wherein the control signals developed are used to modify the supply voltage coupled to energize the input stages of the multistage unit.

A further object of the invention is to provide such a control system which is simple to construct and operate.

BRIEF DESCRIPTION OF THE DRAWINGS

These and other objects of the instant invention will be apparent from a consideration of the following description of preferred embodiments thereof in which.

DETAILED DESCRIPTION OF THE INVENTION

Figure 1:
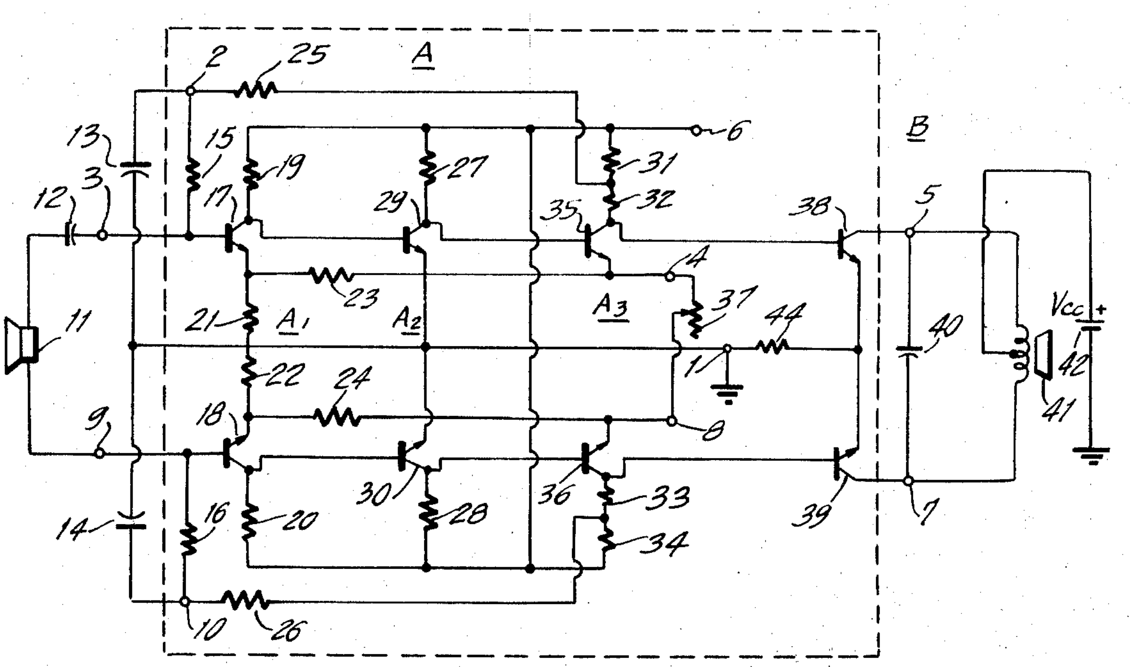
FIG. 1 is an illustrative representation of a direct coupled multistage amplifier in connection with which the present invention provides effective automatic volume control operation.

Referring to FIG. 1, there is shown a multistage direct current coupled audio amplifier which may comprise either a discrete component unit consisting of a preamplifier A and an output stage B or a self-contained integrated circuit amplifier in the form of a sealed block having a limited number of available terminals. Such terminals are represented by the reference numerals 1–10 and, as conventional, are available for external connection. Those components designated by the reference numerals 11–14, 37 and 40–42 are normally connected external to these terminals when the arrangement of FIG. 1 represents an integrated circuit unit. In a hearing aid environment the component 11 represents the usual microphone while the unit 41 represents the speaker for the hearing aid wearer. Reference notation 42 represents a battery or other source of direct energizing potential which may have either the polarity shown or one of opposite polarity in which case, as will be obvious, other polarity reversals (such as transistor types) in the illustrated circuit would be required.

As shown, the preamplifier stage A comprises three direct current coupled stages in common emitter push-pull connection to the appropriate output stage B. Each such stage of the multistage unit includes a transistor (17 and 18, 29 and 30, 35 and 36) having a collector electrode resistively coupled to a source of supply voltage (terminal 6) for the individual stages. In particular, such coupling is effected by resistors 19 and 20 in the first stage $A_1$ by the resistors 27 and 28 in the stage $A_2$ and by the pair of series coupled resistors 31, 32 and 33, 34 in the stage $A_3$. The junctions of these latter resistors 31, 32 and 33, 34 are resistively coupled to the base electrode input of the transistors 17, 18 to provide a conventional d-c feedback network, via resistors 15 and 25 in the first instance (transistor 17) and via resistors 16 and 26 in the second instance (transistor 18).

The emitter electrodes of transistor 17 and 18 are shown connected to a point of reference potential such as ground (terminal 1) by resistors 21 and 22 respectively, while the emitter electrodes of transistors 29 and 30 are directly connected to that reference potential terminal. The corresponding emitter electrodes of the last stage transistors 35 and 36 are coupled to this reference potential terminal 1, by means of resistors 23 and 24, respectively serially coupled with the resistors 23 and 24, respectively serially coupled with the resistors 21 and 22. Also coupled to the reference potential terminal 1 are a pair of capacitors 13, 14, with the capacitor 13 being coupled to the junction of the feedback resistors 15 and 25 (terminal 2) and with the capacitor 14 coupled to the junction of the feedback resistors 16, 26 (terminal 10). The input microphone 11 is shown as being alternately current (a-c) coupled to the base electrodes of the input transistors 17, 18 by means of a capacitor 12 and input terminal 3 in the first case and by input terminal 9 in the second case. Lastly, a variable control potentiometer 37 is externally connected between the emitter electrodes of the transistors 35 and 36 by means of terminals 4 and 8.

The volume control is provided by a variable resistor, 37, between pins 4 and 8. For maximum gain these pins are shorted which eliminates the emitter feedback to the input stage. Connecting them through a resistance effectively places an emitter resistor in the third stage. The resulting emitter degeneration decreases the gain in the third stage, and also increases the degenerative feedback to the first stage, decreasing the overall gain in accordance with the usual formula for feedback $A_F = A/1-\beta A$, where A is open loop gain.

The push-pull output stage B also includes a pair of common emitters coupled transistors 38, 39, the base electrodes of each being shown direct current coupled to the stage $A_3$ of the preamplifier unit A. In particular, the base electrode of these transistors 38 and 39 are shown respectively connected to the collector electrodes of the transistors 35 and 36, while their emitter electrodes are connected together and to the reference potential terminal 1, by means of an added resistor 44. The collector electrodes of these outputs transistors 38 and 39 are also shown coupled across the input winding of an external speaker 41, to a tap of which the operating potential + Vcc for the system 42 is connected. Also, a capacitor 40 is coupled between the collector electrodes of these transistors 38 and 39 (between terminals 5 and 7) for the proper operation of the speaker 41.

Such an amplifier as shown in FIG. 1 within the dotted lines is available in integrated circuit form from for instance Raytheon RM8311, RM8312, RM8321 and RM8322, Westinghouse of Canada: WC183G/V; WC183G/S.

Figure 2:
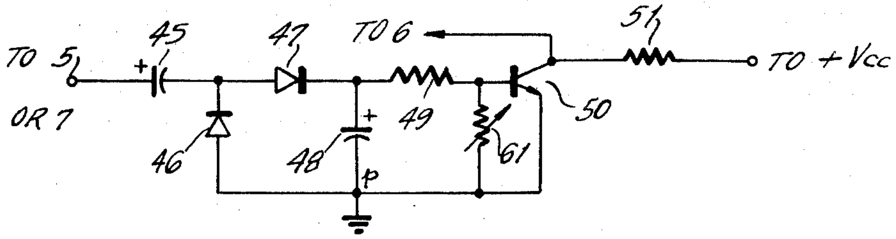
FIGS. 2 and 3 illustrate alternative embodiments of the automatic volume control circuit constructed in accordance with the principals of the present invention.
Figure 3:
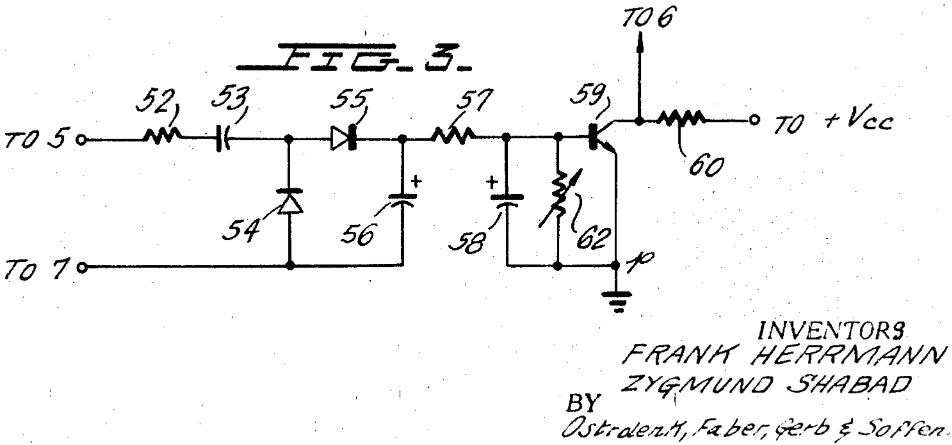

Referring now to FIGS. 2 and 3, there are shown alternative embodiments for developing the automatic volume control voltage by sampling the output signal derived from the collector electrodes of the transistors 38, 39 of FIG. 1. As will be seen, the control voltages developed by the embodiments of FIGS. 2 and 3 are directly connected to terminal 6 of the FIG. 1 system, to provide a supply voltage to the preamplifier stages which varies in accordance with the level of the developed output signal. More importantly, this variable level will be seen to effect the desired control action. Thus, in FIG. 2, the automatic control operation is effected by a transistor 50 having an emitter electrode directly connected to the reference potential point P and a base electrode coupled to receive the signal developed at the collector electrode of either transistor 38 or 39. In particular, the base electrode of transistor 50 is serially coupled to the electrodes of transistors 38 and 39 by means of an input capacitor 45, a semiconductor diode 47 poled in the direction of transistor 50 base current flow and a resistor 49. A second diode 46 having its anode electrode coupled to the point of reference potential P and its cathode electrode connected to the junction of capacitor 45 and the anode electrode of diode 47, cooperates with these elements and with a further capacitor 48 connected between the point P and the cathode electrode of diode 47 to rectify and filter the signal developed at the collector electrode of the input transistor 38 or 39. The collector electrode of the transistor 50 is also shown coupled to the potential source + Vec for the system 42 by means of a load resistor 51, while the base electrode of the transistor 50 is lastly coupled to the reference point P by means of a variable resistor 61. In one construction of this embodiment all of the elements of FIG. 2 were connected external of the integrated clip of FIG. 1.

It will thus be seen that the arrangement of FIG. 2 samples and rectifies the output signal developed at the collector electrode of on e of the output stage transistors 38, 39 of the push-pull amplifier B. The circuit rectifies the output signal, filters it, and employs it to forward bias the transistor 50 to result in a collector current flow through resistor 51. Thus, whereas the output stage B is powdered directly from the full power supply potential + Vcc, the preamplifier stages (terminal 6) are energized from a d-c voltage lower than the + Vcc supply by an amount depending on the voltage drop across resistor 51. As will be seen, this voltage drop is dependent on the amount of forward bias on the transistor 50 which, in turn, depends on the level of the sampled output signal. In other words, the greater the magnitude of the output signal at the collector electrodes of transistor 38 and 39, the greater will be the forward biasing of transistor 50 and the greater the voltage drop across resistor 51, thereby reducing the available voltage for the preamplifier stages at terminal 6. Since the collector currents in the transistors 17, 18, 29, 30, 35, 36 are only slightly dependent on the collector voltage supplied to its, the reduced voltage applied to terminal 6 in the presence of increasingly stronger signals, will not seriously affect the collector currents through the load resistances of those transistors (19, 20, 27, 28, 31-32, 33-34), so that the voltage drops across these resistances will remain substantially unchanged. On the other hand, the direct voltage at the collector electrodes of the respective transistors in the individual stages $A_1$–$A_3$ will be reduced by the amount the preamplifier voltage applied to terminal 6 is reduced. Because of the direct current coupling of the individual stages, this reduced voltage at the collector electrodes of transistors 17 and 18, for example, will result in reduced base to emitter bias voltage in the following transistors 29, 30. This reduced base to emitter voltage further results in less forward bias on the transistors 29, 30 to reduce the collector current in the load resistors 27 and 28 still further, providing higher collector voltages for the transistors 29 and 30 as a result. These higher collector voltages are identical with the base to emitter voltages for the following transistors 35 and 36 due to the d-c coupling, and will result in high collector currents in the load resistances 31–32, and 33–34. As a result, the larger voltage drops in these loads will lower the collector voltages of the transistors 35 and 36 so as to reduce the effective base to emitter bias of the output stage transistors 38, 39. As will be seen, this reduces the forward drive of the output transistors 38, 39 to result in a weaker output signal. The direction of the d-c feedback to the transistors 17 and 18 will also be seen to augment this reduction in voltage at the collector electrodes of transistors 35 and 36. The net result is that the d-c level developed at the output terminal of FIG. 2 (the collector electrodes of transistor 50) controls the overall gain in the amplifier to level the magnitude of output signal swing.

Referring to the arrangement of FIG. 3, it will be seen that the circuit disclosed is generally similar to that of FIG. 2 with some minor modifications. Thus as shown in FIG. 3, a capacitor 58 is connected across the resistor connected across the base to emitter junction of the automatic volume control transistor 59, the emitter electrode of which is directly coupled to the point of reference potential P. The rectifying, filter arrangement of the capacitor 53, diode 54, diode 55 and capacitor 56 is generally similar to the arrangement 45–48 of FIG. 2 with the modifications being the coupling of the capacitor 53 to the collector electrode of transistor 38 by means of an additionally included resistor 52 and with the anode electrode of diode 54 being coupled to the collector electrode of transistor 39 instead of to the reference potential point P. As before, resistor 57 is included to couple the cathode electrode of the diode 55 to the base electrode of the transistor 59, while resistor 60 couples the collector electrode of transistor 59 to the power source 42 in analogous fashion to the resistor 51 of FIG. 2.

In the arrangement of FIG. 3 the AVC samples both halves of the output and therefore has twice the signal to rectify, filter and eventually to forward bias transistor 59 and control the voltage to the preamp.

As will be readily apparent to one skilled in the art, the amount of control voltage developed either in the arrangement of FIG. 2 or FIG. 3 can be varied by changing the value of the resistor coupled across the base to emitter electrode of either the transistors 50 or 59. In this manner, the level of the output signal at which the AVC circuit will be activated and energized can be easily controlled and adjusted by the wearer of the hearing aid unit. Applying AVC to terminals 3 and 9 will unbalance the biasing of the transistors and of the output stage resulting in increased distortion.

Although there have been described preferred embodiments of this novel invention, many variations and modifications will now be apparent to those skilled in the art. Therefore, this invention is to be limited, not by the specific disclosure herein, but only by the appended claims.

The embodiments of the invention in which an exclusive privilege or property is claimed are defined as follows:

1. In combination first (35), second (36), third (38), fourth (39), and fifth (50,59) transistors;

first (6), second (3), third (1), fourth (9), fifth (5), and sixth (7) terminals;

a first resistor (31,32) coupling the collector electrode of said first transistor (35) to said first terminal (6);

means direct current coupling the base electrode of said first transistor (35) to said second terminal (3);

a second resistor (21, 23) coupling the emitter electrode of said first transistor (35) to said third terminal (1);

a third resistor (33, 34) coupling the collector electrode of said second transistor (36) to said first terminal (6);

means direct current coupling the base electrode of said second transistor (36) to said fourth terminal (9);

a fourth resistor (22, 24) coupling the emitter electrode of said second transistor (36) to said third terminal (1);

a direct connection between the base electrode of said third transistor (38) and the collector electrode of said first transistor (35);

means coupling the collector electrode of said third transistor (38) and the collector electrode of said first transistor (35);

means coupling the collector electrode of said third transistor (38) to said fifth terminal (5);

a direct connection from the base electrode of said fourth transistor (39) to the collector electrode of said second transistor (36);

means coupling the collector electrode of said fourth transistor (39) to said sixth terminal (7);

a fifth resistor (44) jointly coupling the emitter electrodes of said third and fourth transistors (38, 39) to said third terminal (1);

means coupling the base electrode of said fifth transistor (50, 59) to the collector electrode of said third transistor (38);

a direct connection from the emitter electrode of said fifth transistor (50, 59) to said third terminal (1);

a sixth resistor (51, 60) at the collector electrode of said fifth transistor (50, 59) to an energizing potential terminal; and a direct current connection from the collector electrode of said fifth transistor (50, 59) to said first terminal (6); said means coupling the collector electrode of said third transistor (38) to said fifth transistor (50) including:

seventh and eighth resistor (49, 61) first and second capacitors (48, 45) and first and second semi-conductor diodes (46, 47);

with the anode electrode of said first diode (46) coupled to said third terminal (1) and with the cathode electrode of said first diode (46) coupled to the anode electrode of said second diode (47);

with said first capacitor (48) coupled between said third terminal (1) and the cathode electrode of said second semiconductor diode (47) and with said second capacitor (45) connected between said fifth terminal (5) and the anode electrode of said second diode (47);

and with said seventh resistor (49) coupled between the base electrode of said fifth transistor (50) and the cathode electrode of said second semiconductor diode (47) and with said eighth resistor (61) coupled between the base electrode of said fifth transistor (50) and said third terminal (1).

2. In combination first (35), second (36), third (38), fourth (39), and fifth (50,59) transistors;

first (6), second (3), third (1), fourth (9), fifth (5), and sixth (7) terminals;

a first resistor (31,32) coupling the collector electrode of said first transistor (35) to said first terminal (6);

means direct current coupling the base electrode of said first transistor (35) to said second terminal (3);

a second resistor (21, 23) coupling the emitter electrode of said first transistor (35) to said third terminal (1);

a third resistor (33, 34) coupling the collector electrode of said second transistor (36) to said first terminal (6);

means direct current coupling the base electrode of said second transistor (36) to said fourth terminal (9);

a fourth resistor (22, 24) coupling the emitter electrode of said second transistor (36) to said third terminal (1);

a direct connection between the base electrode of said third transistor (38) and the collector electrode of said first transistor (35);

means coupling the collector electrode of said third transistor (38) and the collector electrode of said first transistor (35);

means coupling the collector electrode of said third transistor (38) to said fifth terminal (5);

a direct connection from the base electrode of said fourth transistor (39) to the collector electrode of said second transistor (36);

means coupling the collector electrode of said fourth transistor (39) to said sixth terminal (7);

a fifth resistor (44) jointly coupling the emitter electrodes of said third and fourth transistors (38, 39) to said third terminal (1);

means coupling the base electrode of said fifth transistor (50, 59) to the collector electrode of said third transistor (38);

a direct connection from the emitter electrode of said fifth transistor (50, 59) to said third terminal (1);

a sixth resistor (51, 60) at the collector electrode of said fifth transistor (50, 59) to an energizing potential terminal; and a direct current connection from the collector electrode of said fifth transistor (50, 59) to said first terminal (6), and seventh, eighth and ninth resistors, first, second and third capacitors, and first and second semiconducted diodes (54, 55);

with the anode electrode of said first diode (54) coupled to said sixth terminal (7) and with the cathode electrode of said first diode (54) connected to the anode electrode of said second semiconducted diode (55);

with said seventh resistor (62) connected between the base electrode of said fifth transistor (59) and said third terminal (1) and with said eighth resistor (57) coupled between the base electrode of said fifth transistor (59) and the cathode electrode of said second semiconductor diode (55);

with said first capacitor (58) coupled between the base electrode of said fifth transistor (59) and said third terminal (1) and with said second capacitor (56) connected between the anode electrode of said first diode (54) and the cathode electrode of said second diode (55);

and with said ninth resistor (52) and said third capacitor (53) connected in series arrangement in the order named between said fifth terminal (5) and the anode electrode of said second semiconductor diode 55.

* * * * *